Jan. 3, 1967 L. TASSARA 3,296,574

FILM RESISTORS WITH MULTILAYER TERMINALS

Filed Dec. 21, 1962

INVENTOR.
LUIGI TASSARA

BY Donald P. Gillette

ATTORNEY 3,296,574
Patented Jan. 3, 1967

3,296,574

FILM RESISTORS WITH MULTILAYER TERMINALS

Luigi Tassara, Viale Sarca 94, Milan, Italy

Filed Dec. 21, 1962, Ser. No. 246,421
2 Claims. (Cl. 338—309)

This invention relates to a process for making components for electrical circuits and particularly for resistors for use in printed circuits.

One of the objects of this invention is to produce uniform components and particularly uniform resistors adapted to be directly soldered to printed terminals of printed electronic circuits. Other objects will be apparent after studying the following specification.

The process of this invention comprises the steps of depositing on a suitable insulating base material a first layer of conductive material having a suitable resistivity, then masking off certain areas of the conductive material and applying, to the unmasked areas and by means of evaporation in a vacuum, first a layer of metal having the property of adhering firmly to the conductive material and then a layer of metal alloyable with the first metal layer. Finally, a layer of conductive material is applied to the alloyable metal. The mask may be removed either before or after the last-named layer is applied, and the surface previously covered by the mask thereafter covered with a suitable insulating material and the entire structure heated to polymerize the insulating material and to achieve a suitable bonding of the various layers with one another. The outermost layer of conductive material may be coated with solder and the sheet of insulating material broken up into small pieces to form individual electronic components. Thereafter these components may be soldered directly to a printed circuit by placing them upon the printed circuit with the solder layer of the component in contact with a suitable prepared conductive terminal region of the printed circuit.

The invention will be described in greater detail in connection with the drawings in which.

Figure 1:
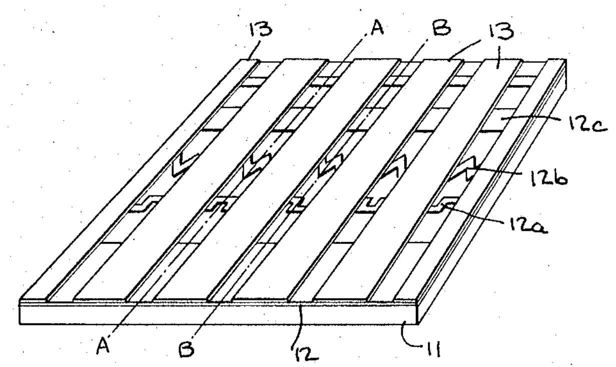
FIG. 1 shows an insulating board in an early stage of the process of this invention.

FIG. 1 shows an insulator, or substrate, 11 in the form of a flat sheet of material, such as glass, which has suitable electrical and mechanical characteristics, including sufficent strength to stand up under stresses likely to be imposed upon it and sufficient heat resistance to undergo the processing which will be described hereinafter. The sheet 11 forms a substrate upon which is deposited, preferably by evaporation in a vacuum, a layer 12 of material having a predetermined conductivity. For the manufacture of resistors the material of which the layer 12 may conveniently be of Nichrome or another resistance material having the desired characteristics of uniformity of resistance per unit area as well as uniformity in spite of temperature changes. The resistance per unit area of the layer 12 may be determined by the thickness of the layer, which would require different conditions of evaporation of the material according to the different resistances desired, or the resistance per unit area may be determined by keeping the thickness of the layer constant but masking off certain areas of the substrate 11 so that the layer 12 is deposited only in restricted regions as indicated by the patterns 12*a*, 12*b*, and 12*c*. The exact resistance may be further fixed by grinding away selected portions of the layer 12, leaving only enough to form a predetermined resistance path across the upper surface of the substrate 11.

Thereafter a mask in the form of a series of strips 13 is applied ot the layer 12 to shield, or mask, certain selected portions thereof. These strips 13 are preferably straight and parallel to each other, and they may be spaced apart by a distance approximately equal to one of the standard distances of printed circuits as will be more fully explained hereinafter. Once the strips 13 are in place a second layer 14 is evaporated in a vacuum over the mask 13 and the exposed parts of the layer 12. The material of which the layer 14 consists is an alloy or metal which preferably has very low resistivity, good adherence to the layer 12 as well as to the substrate 11 (as would be required for example between the strips 12*a* and 12*b* or 12*b* and 12*c*) and the capacity for absorbing, by diffusion, a subsequent layer of a noble metal. It has been found that nickel, copper-manganese, and silver are three suitable materials for the layer 14.

Figures 2, 3, 4, 5, 6:
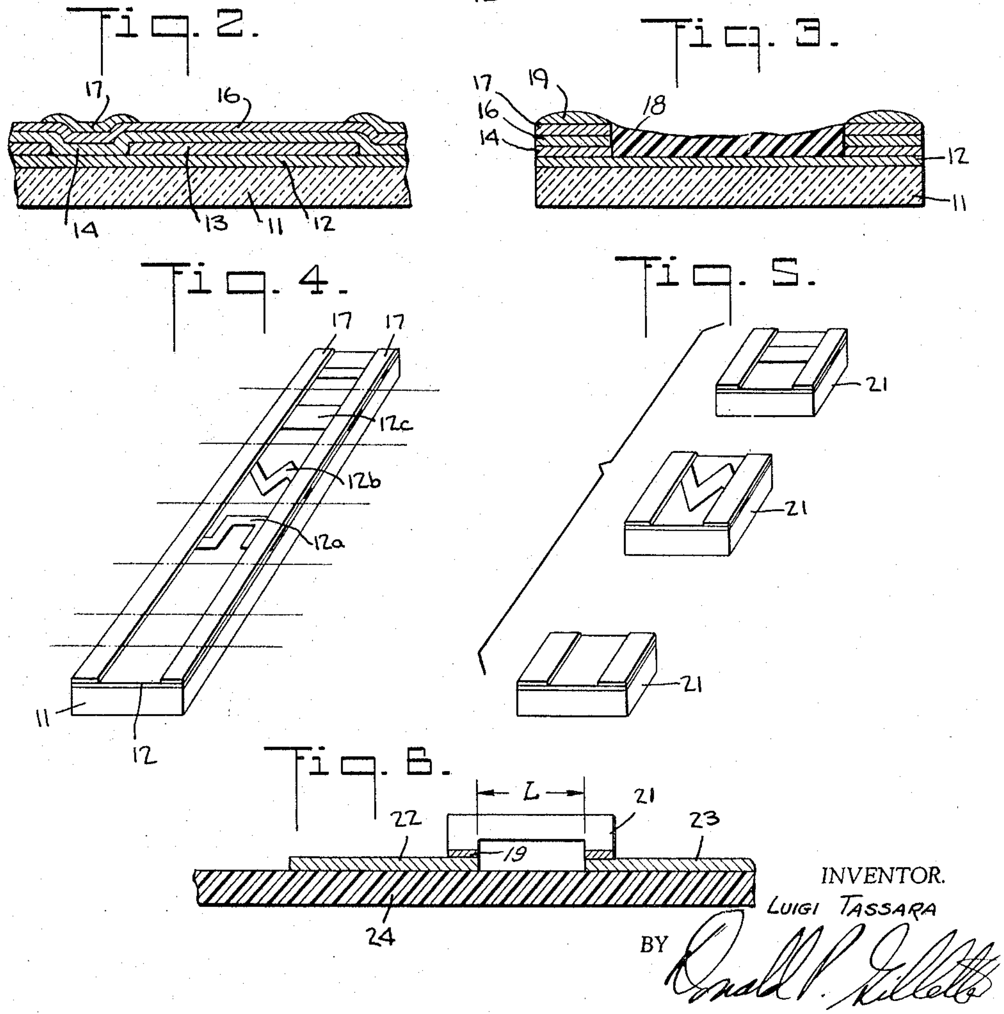
FIG. 2 shows a cross-section of a portion of the board of FIG. 1 at a later stage of the process.
FIG. 3 shows a cross-sectional view of the portion in FIG. 2 of a still later stage.
FIG. 4 shows an isometric view of the portion in FIG. 3.
FIG. 5 shows three components cut from the portion shown in FIG. 4.
FIG. 6 shows one of the components assembled in a printed circuit.

FIG. 2 shows a fragment of the substrate 11, the layer 12, and one of the masking strips 13 as well as additional layers applied later. The first additional layer is a layer 16 of noble metal, for example gold, which is alloyable with the layer 14. Layer 11 is deposited by evaporation in a vacuum on top of the layer 14. Following the deposition of the layer 16, a conductive layer 17 is applied at least over the regions not covered by the mask 13. The layer 17 may be silver varnish or another form of relatively highly conductive metal contained in or mixed with a carrier that can be fired or heated to produce a hard, conductive terminal. The layer may be applied by a brush, in which case the masking strips 13 may be removed beforehand, or by means of a spray or by any other convenient method, in which case the masking strips 13 may be kept in place until after the layer 17 is in place.

After the masking strips have been removed, as shown in FIG. 3, a suitable insulating protective layer, such as varnish or lacquer or glass enamel 18 is applied to the area formerly covered by the masking strips and the whole coated substrate assembly is placed in an oven at a temperature sufficiently high (in the region of about 300° C. to 350° C.) to enable the layer 16 to diffuse into the layers 14 and 17. At the same time the protective lacquer or varnish 18 is also baked to polymerize it, or if the material 18 is glass enamel, to change it into a hard, thin layer of glass.

After baking, the sheet 11 is then separated into strips by means of cuts along the lines A—A, B—B, and so forth, so as to obtain a series of elements one of which is shown in FIG. 4. In dividing the sheet 11, the cuts are made so that the upper surface of the conductive strip 17 runs along each edge thereof. Either before or after the cutting it is possible to cover the upper surface of the layer 17 with a layer of solder 19 as shown in FIG. 3. This may be done by immersing either the plate 11 or the individual elements thereof in a bath of molten tin and lead or of tin and silver or of one of the other soldering alloys.

The resistance between the two opposite conductive strips 17 may be measured and the sheet 11 further divided along lines B—B into individual blocks the resistance of each of which may be made exactly equal to a predetermined resistance merely by spacing the cuts B—B closer together or farther apart. Three such individual components are indicated by reference characters 21 in FIG. 5.

The width of the masking strips 13 is indicated by the letter L in FIG. 6, this being the modular separation between terminal strips 22 and 23 of a printed circuit board 24. One of the advantages of printed circuits is that they have been standardized by certain spacings to permit standardized construction and to enable them to use standardized components. In assembling the component 21 to the terminal strips 22 and 23, which are normally coated with solder, it is merely necessary to place the component 21 so that its own solder layers 19 are in contact with the surfaces of the terminal strips 22 and 23 and then to heat the entire assembly until the solder layers 19 joint to the terminals 22 and 23. This eliminates the necessity for using lengths of wire for terminals and makes a most convenient and direct connection between the electronic component 21 and the printed circuit.

While this invention has been described in terms of a specific embodiment and a specific series of steps, it will be apparent to those skilled in the art that the true scope of the invention is broader and is limited only by the following claims.

What is claimed is:

1. A resistor comprising: a rigid insulating substrate; a first layer of nickel-chromium alloy resistive material thereon; at least two conductive terminals contacting different parts of the surface of said resistive material and each comprising a second layer of metal selected from the group consisting of nickel, copper-manganese, and silver, said second layer covering and adhering to one of said parts of the surface of said resistive material, a layer of metal which is relatively highly conductive compared to said resistive material, and a bridging layer of metal between said conductive metal layer and said second layer and in surface-to-surface contact with both said conductive metal layer and said second layer and capable of alloying with said second layer; and an impervious layer of insulating material covering said resistive material between said terminals.

2. A resistor comprising; a rigid insulating substrate; a first layer of Nichrome thereon; at least two conductive terminals, each covering different parts of the surface of said Nichrome and each comprising a second layer of metal selected from the group consisting of nickel, copper-manganese, and silver, said second layer covering and adhering to one of said parts of the surface of said resistive material; a layer of silver, and a gold bridging layer between said silver layer and said second layer and in surface-to-surface contact with both said silver layer and said second layer; an impervious layer of insulating material covering said resistive material between said terminals; and a layer of solder on said layer of silver.

References Cited by the Examiner

UNITED STATES PATENTS

| | | | |
|---|---|---|---|
| 2,475,379 | 7/1949 | Stong | 338—309 |
| 2,628,299 | 2/1953 | Gaiser | 338—309 X |
| 2,644,066 | 6/1953 | Glynn | 338—329 X |
| 2,648,754 | 8/1953 | Lytle | 219—541 |
| 2,668,932 | 2/1954 | Kliever | 338—309 X |
| 2,693,023 | 11/1954 | Kerridge et al. | 29—155.7 |
| 2,761,945 | 9/1956 | Colbert et al. | 338—308 X |
| 2,786,925 | 3/1957 | Kahan | 338—308 X |
| 2,827,536 | 3/1958 | Moore et al. | 29—155.7 |
| 2,863,034 | 12/1958 | Tassara | 338—309 |
| 2,882,377 | 4/1959 | Rinehart | 219—543 X |
| 2,977,450 | 3/1961 | Boicey | 219—541 |
| 3,020,376 | 2/1962 | Hofmann et al. | 219—543 X |

RICHARD M. WOOD, *Primary Examiner.*

V. Y. MAYEWSKY, *Assistant Examiner.*